(12) United States Patent
Araki et al.

(10) Patent No.: US 8,867,177 B2
(45) Date of Patent: Oct. 21, 2014

(54) MAGNETIC SENSOR HAVING IMPROVED RESISTANCE TO THERMAL STRESS INDUCED INSTABILITY

(75) Inventors: Satoru Araki, San Jose, CA (US); Hardayal S. Gill, Palo Alto, CA (US); Hiroaki Chihaya, Odawara (JP); Dustin W. Erickson, Morgan Hill, CA (US); Haiwen Xi, San Jose, CA (US); Chang Man Park, Los Altos, CA (US)

(73) Assignee: HGST Netherlands B.V., Amsterdam (NL)

( * ) Notice: Subject to any disclaimer, the term of this patent is extended or adjusted under 35 U.S.C. 154(b) by 829 days.

(21) Appl. No.: 12/914,926

(22) Filed: Oct. 28, 2010

(65) Prior Publication Data
US 2012/0106006 A1 May 3, 2012

(51) Int. Cl.
*G11B 5/33* (2006.01)
*G11B 5/39* (2006.01)
*G11B 5/31* (2006.01)
*B82Y 25/00* (2011.01)
*G01R 33/09* (2006.01)
*G11B 5/60* (2006.01)

(52) U.S. Cl.
CPC ............. *G11B 5/607* (2013.01); *G11B 5/3967* (2013.01); *G11B 5/3106* (2013.01); *G11B 5/3133* (2013.01); *B82Y 25/00* (2013.01); *G01R 33/093* (2013.01); *G11B 5/3906* (2013.01)
USPC .................................................. 360/324.11

(58) Field of Classification Search
None
See application file for complete search history.

(56) References Cited

U.S. PATENT DOCUMENTS

| | | | | |
|---|---|---|---|---|
| 4,703,380 A * | 10/1987 | Imamura et al. | ............... | 360/121 |
| 6,038,107 A * | 3/2000 | Pinarbasi | ................. | 360/324.11 |
| 6,122,150 A * | 9/2000 | Gill | ......................... | 360/324.11 |
| 6,327,122 B1 | 12/2001 | Pinarbasi | | |
| 6,353,518 B2 * | 3/2002 | Pinarbasi | ................. | 360/324.11 |
| 6,449,134 B1 * | 9/2002 | Beach et al. | ............. | 360/324.12 |
| 6,538,859 B1 * | 3/2003 | Gill | ......................... | 360/324.12 |
| 6,549,383 B1 * | 4/2003 | Gill | ......................... | 360/324.11 |
| 6,580,588 B1 * | 6/2003 | Gill | ............................ | 360/324.1 |
| 6,693,776 B2 * | 2/2004 | Gill | ......................... | 360/324.12 |
| 6,728,078 B2 * | 4/2004 | Gill | ............................. | 360/314 |
| 6,741,432 B2 * | 5/2004 | Pinarbasi | ................. | 360/324.11 |
| 6,831,312 B2 | 12/2004 | Slaughter et al. | | |
| 7,001,680 B2 * | 2/2006 | Gill | ........................... | 428/811.1 |
| 7,564,236 B1 | 7/2009 | Call et al. | | |
| 7,593,196 B2 | 9/2009 | Gill | | |
| 7,602,033 B2 | 10/2009 | Zhao et al. | | |
| 7,672,089 B2 | 3/2010 | Lin | | |
| 2008/0316657 A1 | 12/2008 | Zhang et al. | | |
| 2009/0168267 A1 | 7/2009 | Lin | | |
| 2009/0244791 A1 | 10/2009 | Lin | | |
| 2009/0296286 A1 | 12/2009 | Lin | | |
| 2010/0128400 A1 | 5/2010 | Lin | | |

* cited by examiner

*Primary Examiner* — David D Davis
(74) *Attorney, Agent, or Firm* — Zilka-Kotab, PC

(57) ABSTRACT

A magnetic read sensor having improved robustness to withstand thermal variations resulting from thermal fly height heating. Improved thermal robustness comes as a result of improved pinned layer pinning. The read head includes an AFM layer having an increased thickness to provide a higher blocking temperature. The read head further includes a pinned layer structure that includes a first magnetic layer adjacent to and exchange coupled with the AFM layer. The first layer comprises a Co—Fe layer with an increased Fe content of 20-30 atomic percent. The pinned layer structure also includes a second magnetic layer that is antiparallel coupled with the AP1 layer. The AP2 layer can be a multilayer structure that includes a layer of CoFe, a layer of Co—Fe—Hf formed on the layer of Co—Fe, a layer of Co—Fe—B formed on the layer of Co—Fe—Hf, and a second layer of Co—Fe formed on the layer of Co—Fe—B.

22 Claims, 5 Drawing Sheets

MAGNETIC SENSOR HAVING IMPROVED RESISTANCE TO THERMAL STRESS INDUCED INSTABILITY

FIELD OF THE INVENTION

The present invention relates to magnetic heads for data recording, and more particularly to a magnetoresistive sensor having improved pinned layer pinning for providing improved robustness to thermal stress.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

Data can be written to the magnetic media by a write head that includes a magnetic write pole having a small cross section at the air bearing surface, and a magnetic return pole having a larger cross section at the air bearing surface. An electrically conductive write coil generates a magnetic field that causes a magnetic flux to flow through the write pole and return pole. The small cross section of the write pole allows a dense, strong write field to emit from the tip of the write pole toward the magnetic medium where it magnetizes a high magnetic coercivity top layer on the magnetic media. The resulting magnetic flux then travels through a magnetically soft under-layer of the magnetic media, to return to the write head at the return pole, where it is sufficiently spread out and weak that it does not erase previously recorded bits of data.

A magnetoresistive sensor such as a GMR or TMR sensor has been employed for sensing magnetic fields from the rotating magnetic disk. The sensor includes a nonmagnetic conductive layer, or barrier layer, sandwiched between first and second ferromagnetic layers, referred to as a pinned layer and a free layer. First and second leads are connected to the sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In current magnetic recording systems, the height at which the slider passes over the magnetic media (fly height) is very small and is a critical parameter for the performance of the recording system. In order to control the height of the read and write heads over the media at these extremely low fly heights, the recording system can incorporate thermal fly height control. In such a system a heating element can be placed near the read and write heads to locally and controllably heat the area around and within the read and write head. When heated, thermal expansion causes the read and write heads to protrude by a desired, controllable amount. However, such thermally controlled fly height systems present their own challenges, in that the heat from the heating element can adversely affect the performance of the magnetic sensor.

SUMMARY OF THE INVENTION

The present invention provides a magnetic read head that includes a layer of antiferromagnetic material having a thickness of 65-80 Angstroms, and a first magnetic layer formed directly on the layer of antiferromagnetic material, the first magnetic layer comprising Co—Fe with 20-30 atomic percent Fe. The magnetic read head also includes a non-magnetic antiparallel coupling layer formed on the first magnetic layer; and a second magnetic layer formed on the non-magnetic antiparallel coupling layer.

The second magnetic layer can be a multi-layer structure that comprises: a first magnetic sub-layer comprising Co—Fe; a second magnetic sub-layer comprising Co—Fe—B; a third magnetic sub-layer comprising Co—Fe—Hf; and a fourth magnetic sub-layer comprising Co—Fe. The AFM layer can be constructed of IrMn.

The novel pinned layer and AFM structure increases the blocking temperature of the AFM, and increases magnetic moment of the first and second magnetic layers of the pinned layer structure which allows the first and second magnetic layers to be made thinner for improved antiparallel coupling. In addition, the material makeup of the first and second magnetic layers also improves magnetostriction assisted pinning. All of this together serves to synergistically improve pinning robustness to maintain excellent sensor operation in the face of thermal stresses such as can result from thermal fly height control heating.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
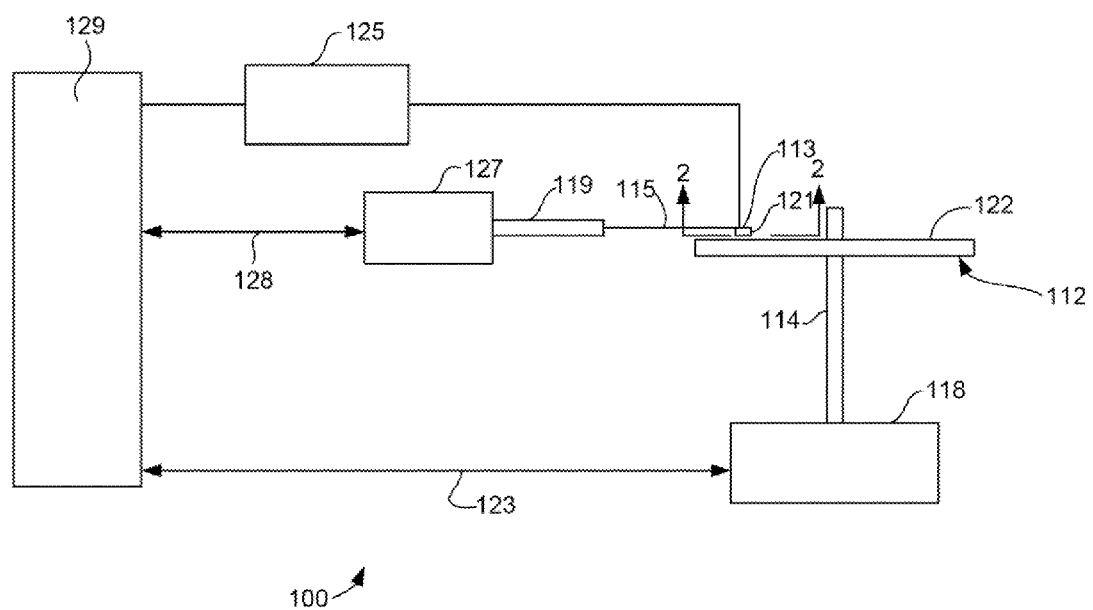
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
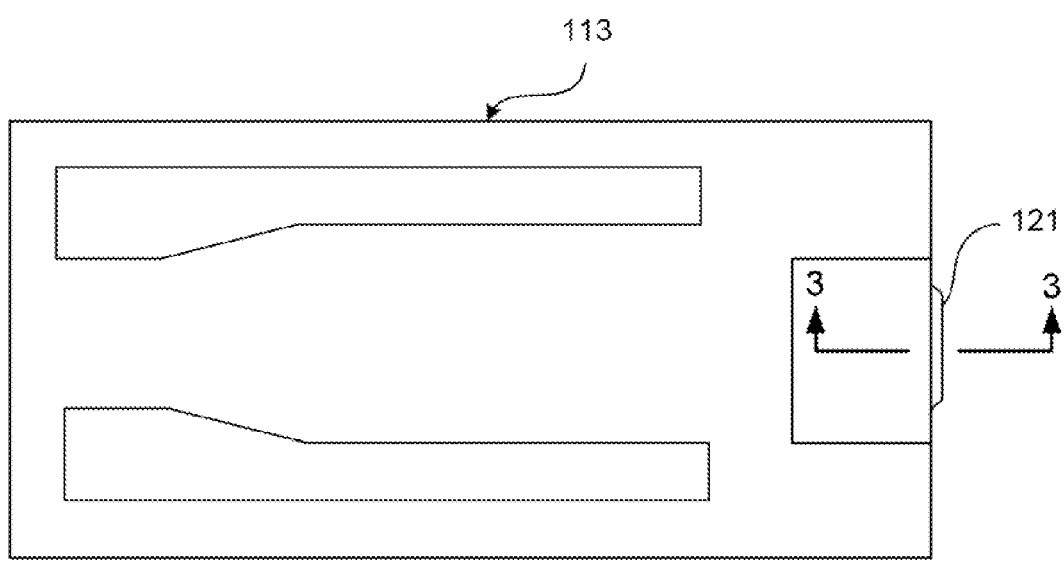
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
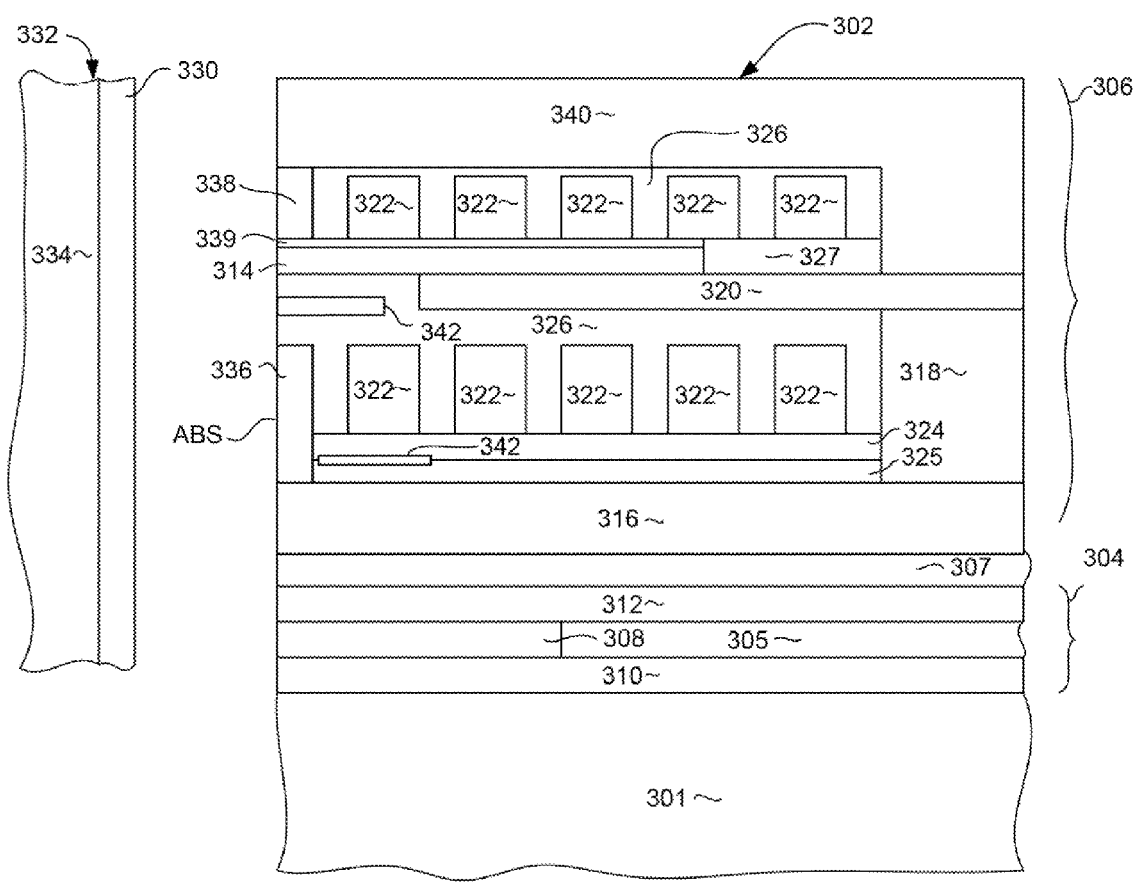
FIG. 3 is a cross sectional view of a magnetic head, taken from line 3-3 of FIG. 2 and rotated 90 degrees counterclockwise, of a magnetic read/write head according to an embodiment of the present invention.

With reference now to FIG. 3, the invention can be embodied in a magnetic head 302. The magnetic head 302 includes a read head 304 and a write head 306. The read head 304 includes a magnetoresistive sensor 308, which can be a giant magnetoresistive sensor (GMR), tunnel junction magnetoresistive sensor (TMR), or some other type of sensor. The magnetoresistive sensor 308 is located between first and second magnetic shields 310, 312. If the sensor 308 is a current perpendicular to plane sensor such as a current perpendicular to plane GMR sensor or a TMR sensor, the magnetic shields 310, 312 can be constructed of an electrically conductive material so that they may function as electrically conductive leads as well as magnetic shields. An insulation layer 307 can also be provided between the read head 304 and write head 306, and can be formed of a material such as alumina.

The write head 306 includes a magnetic write pole 314 and a magnetic return pole 316. The write pole 314 can be formed upon a magnetic shaping layer 320, and a magnetic back gap layer 318 magnetically connects the write pole 314 and shaping layer 320 with the return pole 316 in a region removed from the air bearing surface (ABS). A write coil 322 (shown in cross section in FIG. 3) passes between the write pole and shaping layer 314, 320 and the return pole 316, and may also pass above the write pole 314 and shaping layer 320. The write coil can be a helical coil or can be one or more pancake coils. The write coil 322 can be formed upon an insulation layers 324, 325 and 327 and can be embedded in a coil insulation layer 326 such as alumina and or hard baked photoresist.

In operation, when an electrical current flows through the write coil 322. A resulting magnetic field causes a magnetic flux to flow through the return pole 316, back gap 318, shaping layer 320 and write pole 314. This causes a magnetic write field to be emitted from the tip Of the write pole 314 toward a magnetic medium 332. The write pole 314 has a cross section at the ABS that is much smaller than the cross section of the return pole 316 at the ABS. Therefore, the magnetic field emitting from the write pole 314 is sufficiently dense and strong that it can write a data bit to a magnetically hard top layer 330 of the magnetic medium 332. The magnetic flux then flows through a magnetically softer under-layer 334, and returns back to the return pole 316, where it is sufficiently spread out and week that it does not erase the data bit recorded by the write head 314. A magnetic pedestal 336 can be provided at the ABS, and attached to the leading return pole 316 to act as a magnetic shield to prevent stray field from the write coil 322 from inadvertently reaching the magnetic media 332.

In order to increase write field gradient, and therefore, increase the speed with which the write head 306 can write data, a trailing, magnetic shield 338 can be provided. The trailing, magnetic shield 338 is separated from the write pole by a non-magnetic write gap 339, and may be connected with the shaping layer 320 and/or back gap 318 by a trailing return pole 340. The trailing shield 338 attracts the magnetic field from the write pole 314, which slightly cants the angle of the magnetic field emitting from the write pole 314. This canting of the write field increases the speed with which write field polarity can be switched by increasing the field gradient. The non-magnetic trailing gap layer 339 can be constructed of a material such as Rh, Ir or Ta.

As mentioned above, the magnetic head 302 should fly as close as possible to the magnetic media 330, without actually contacting the media 330 (i.e. "crashing"). The magnetic signal from the media 330 and magnetic write field from the write head 306 decrease exponentially with increasing distance between the media 330 and the head 302. Thermal fly height modulation can be used to control and minimize the spacing between the media 330 and the read and write heads 304, 306. To this end, a heater 342, such as a resistive heater, can be placed within the head 302. As shown in FIG. 3, the heater 342 can be located between the return pole 316 and the write coil 322, and sandwiched between insulation layers 324, 325, which can be a material such as alumina. However, the heater 342 could be located at some other location within the head 302. In order to decrease the spacing between the media 330 and the read and write heads 304, 306, the heater can heat the read and write heads 304, 306. This heating results in a thermal expansion of the read and write heads 304, 306, which causes the read and write heads 304, 306 to protrude at the ABS. If the read and write heads 304, 306 come too close to the media 330 (so that they risk contacting the media), the amount of thermal protrusion of the read and write heads 304, 306 can be reduced by reducing the heating provided by the heater element 342.

Read heads such as the read head 304 which employ a heat element 342 have experienced excessively large amplitude spike. These spikes have been referred to as instability in the sensor signal. These spikes have been found to result from thermal stresses in one or more of the shields 310, 312, as a result of heat from the heater element 342. In addition, heat from the write head 306 also contributes to such thermal stresses. When the shields are heated, thermal expansion of the shields 310, 312 causes a mechanical stress in the shields 310, 312. These mechanical stresses in the shields 310, 312 cause magnetic domains within the shields 310, 312 to move around as a result of magnetostriction inherent in the shields themselves. Because the shields 310, 312 are magnetostatically coupled with the sensor, this results in a magnetic field affecting the sensor 308. This magnetic field is sensed by the sensor 308, resulting in the above described instability. The domain wall movement in the shields 310, 312 (in particular, the upper shield 312 which is closer to the sensor and hard bias layers) can also demagnetize the hard bias layers (not shown) and thereby increase instability. In an effort to minimize such thermally induced instability, the material composition and thickness of the shields can be controlled to some extent to minimize the magnetostriction of the shields 310, 312. However, it is difficult to achieve the necessary composition and thickness uniformity across a wafer or between wafers. The inventors have found, surprisingly, that the deleterious effects of the heating can be greatly minimized by increasing the pinning strength of the pinned layer structure.

Figure 4:
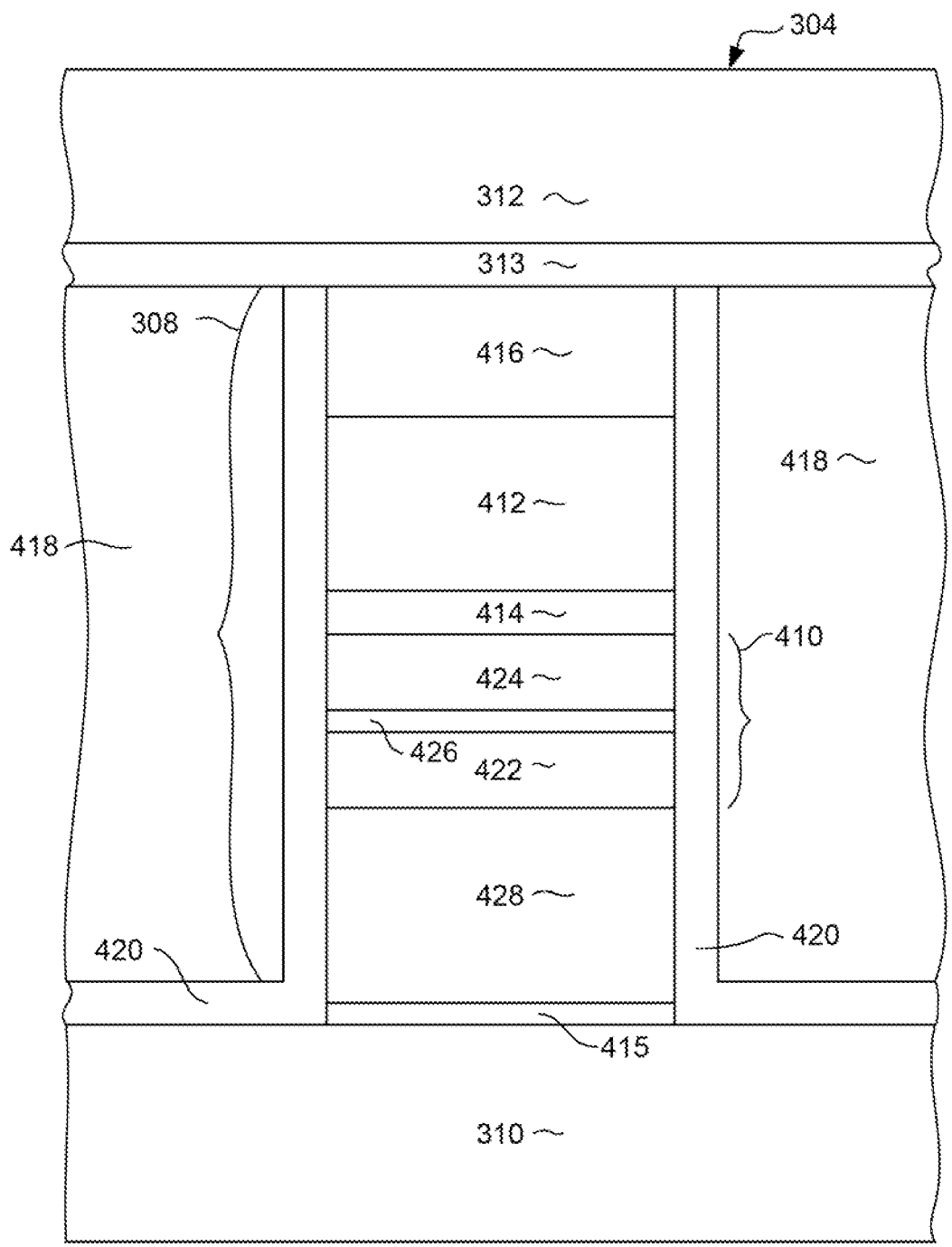
FIG. 4 is an enlarged ABS view of a magnetic sensor.

FIG. 4 shows a schematic illustration of a magnetic read head 304, including a magnetoresistive sensor 308 sandwiched between first and second shields 310, 312. A top lead layer 313 is formed between the top shield 312 and the sensor stack 308 and hard bias layers 418. The top lead layer 313 can be constructed of a non-magnetic, electrically conductive material such as Ru, and the thickness of the top lead layer can be adjusted to maintain a desired read gap (space between shields 310, 312) when the thicknesses of the various layers of the sensor stack 308 change. The sensor stack 308 includes a pinned layer structure 410, a free layer structure 412 and a non-magnetic barrier or spacer layer 414 sandwiched between the pinned layer structure 410 and free layer structure 412. If the sensor 308 is a GMR sensor, then the layer 414 is a non-magnetic, electrically conductive spacer layer such as Cu. If the sensor 408 is a tunnel valve (TMR) sensor, then the layer 814 is a non-magnetic, electrically insulating barrier layer 414. A capping layer 416 can be provided at the top of the sensor stack 308 to provide protection to the under-lying layers during manufacture, such as during annealing. The capping layer 416 can be a material such as Ta, but can include additional layers or materials as well. In addition, a seed layer structure 415 can be provided at the bottom of the sensor stack 308 to promote a desired grain growth in the above deposited sensor layers.

The free layer 412 can be constructed of one or more layers of a magnetic material such as Co—Fe or Ni—Fe. First and second hard bias layers 418 are provided at either side of the sensor stack 308 to provide a magnetic bias field for biasing the magnetization of the free layer 412 in a desired direction parallel with the air bearing surface. The hard bias layers 418 can be a material such as CoPt, or CoPtCr, and are separated from the sensor stack 308 and from at least one of the shields 310 by a non-magnetic, electrically insulating layer 420, which can be a material such as alumina ($Al_2O_3$).

The pinned layer structure 410 is an antiparallel coupled structure that includes a first magnetic layer (AP1) 422, a second magnetic layer (AP2) 424 and a non-magnetic, antiparallel coupling layer 426 such as Ru. The AP1 layer has its magnetization pinned by exchange coupling with a layer of antiferromagnetic material 428. As mentioned above, the inventors have found that increasing the blocking temperature (Tb) of the pinned layer structure 410 reduces the effect of thermal heat spikes. To this end, the AFM preferably has a thickness of 65 to 80 Angstroms. This is larger than previous sensors, and since sensor design generally includes the goal of reducing the gap thickness (i.e. spacing between the shields 310, 312) the state of the art generally teaches away from increasing the thickness of the AFM 428 in this way. This increase in AFM thickness helps to increase the blocking temperature (Tb) of the AFM layer 428. The increase in blocking temperature (Tb) is about 2 degrees C. for a 1 Angstrom increase in IrMn thickness. Therefore, this design makes the head more stable at elevated temperature operation.

Another way to improve thermal stability of the head is to increase the pinning strength of the AP1 layer 422. To increase the pinning strength of the AP1 layer 422, the AP1 layer is constructed of a Co—Fe alloy having an increased Fe concentration. To this end, the AP1 layer is preferably constructed of CoFe having a Fe concentration in the range of 20 to 30 atomic percent.

In addition to increasing the blocking temperature of the AP1 layer 422, this increased Fe concentration also provides the added benefit of increasing the magnetic moment of the AP1 layer. This advantageously allows the AP1 layer to be made thinner, which also serves to improve antiparallel coupling between the AP1 layer 422 and the AP2 layer 424. The AP1 layer 422 can have a magnetic thickness that is equivalent to a layer of $Ni_{80}$—$Fe_{20}$ having a thickness of about 4.3 nm.

Figure 5:
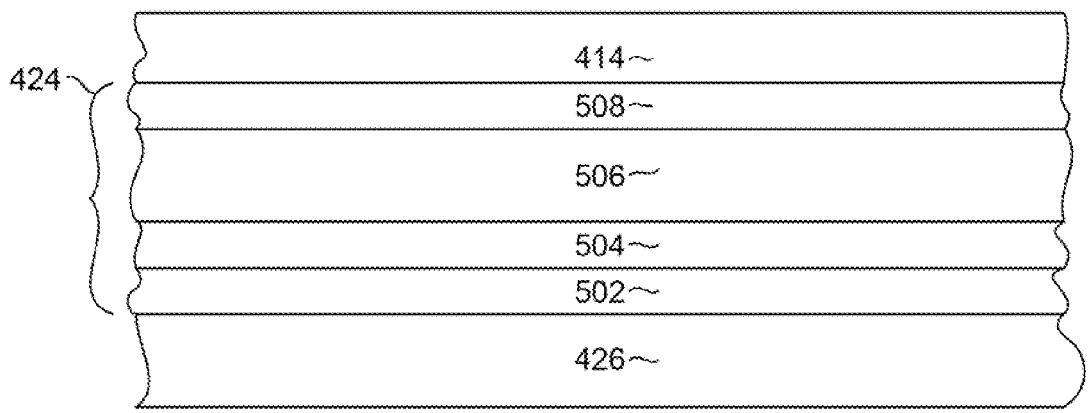
FIG. 5 is an enlarged ABS view of an AP1 layer of the sensor of FIG. 4.

To further improve pinning, the AP2 layer 424 is constructed as a multi-layer structure that increases magnetic moment, allowing the AP2 layer to be thinner, which increases the antiparallel coupling between the AP1 layer 422 and the AP2 layer 424. With reference to FIG. 5, the AP2 layer 424 is preferably a multi-layer structure that includes first, second, third and fourth layers 502, 504, 506, 508. The first layer 502 formed directly on top of the AP coupling layer 426 is a layer of Co—Fe having a thickness of about 6 Angstroms. The second layer 504, formed on the first layer 502, is a layer of Co—Fe—Hf having a thickness of about 6 Angstroms. The third layer 506, formed on the second layer 504, is constructed of Co—Fe—B and has a thickness of about 10 Angstroms. The third layer preferably has about 34 atomic percent Fe and about 15 atomic percent B. This formulation of the third layer provides significant improvement in magnetic moment, allowing a corresponding decrease in thickness of the AP2 layer 424 and significantly increasing the antiparallel coupling between the AP1 and AP2 layers 422, 424. The fourth layer 508, formed over the third layer 506, is constructed of CoFe and has a thickness of about 6 Angstroms. The AP2 424 has a magnetic thickness that is equivalent to a layer of $Ni_{80}Fe_{20}$ having a thickness of about 4.0 nm. Therefore, the AP1 and AP2 layers 422, 424 together have a net thickness difference (dM(AP2−AP1)) of about −3 Angstroms.

The above described read head 304 has a greatly improved robustness to heat spikes resulting from a thermal fly height control heater. The improved pinning reduces signal noise such as "popcorn" noise resulting from such heating and also prevents loss of pinned layer pinning.

Improved AP1 and AP2 layers 422, 424 provide enhanced stability at room temperature operation. To further improve the thermal stability at elevated temperature, improved AP1 and AP2 layer structures 422, 424 are combined with a thicker IrMn layer to reduce spike noise at elevated temperature. Using a higher Fe content in the AP1 and AP2 layers 422, 424 improves pinning through improved antiparallel coupling, as discussed above. However, other factors play a role as well.

The higher Fe content in the AP1 and AP2 layers 422, 424 also makes the layers more positively magnetorestrictive. This improves pinning as a result of net compressive stresses in the sensor 304. However, this also makes the pinned layer structure 410 more sensitive to stress variations in the head 304. Such stress variations can occur as a result of thermal cycling such as can result from thermal stresses from the thermal heater 342 (FIG. 3).

It has been observed that head instability increases with thermal fly height control power application. In spite of strong room temperature pinning, the head becomes unstable as temperature rises due to a drop in pinning resulting from stress variation. Higher temperatures, such as can result from thermal fly height control power application, cause an increase in tensile stress leading to lower compressive stress, and therefore lower pinning. In addition such higher temperatures result in a drop in pinning as a result of a drop in exchange pinning at the interface between the AFM layer 428 and the AP1 layer 422, when the blocking temperature is not sufficiently high. Therefore, the structure as described above with reference to FIGS. 4 and 5, which uses a higher Fe content in the AP1 and AP2 layers along with a thicker IrMn AFM layer 428 (for higher blocking temperature) leads to a more stable head response at elevated temperature or under thermal fly height control power application.

Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

The invention claimed is:

1. A magnetic read head, comprising:
a layer of antiferromagnetic material having a thickness of 65-80 Angstroms;
a first magnetic layer formed directly on the layer of antiferromagnetic material, the first magnetic layer comprising Co—Fe with 20-30 atomic percent Fe;
a non-magnetic antiparallel coupling layer formed on the first magnetic layer; and
a second magnetic layer formed on the non-magnetic antiparallel coupling layer;
wherein the second magnetic layer is a multi-layer structure that comprises:
a first magnetic sub-layer comprising Co—Fe;
a second magnetic sub-layer comprising Co—Fe—B;
a third magnetic sub-layer comprising Co—Fe—Hf; and
a fourth magnetic sub-layer comprising Co—Fe.

2. The magnetic read head as in claim 1 wherein the second magnetic layer is a multi-layer structure that comprises:
a first magnetic sub-layer comprising Co—Fe and having a thickness of about 6 Angstroms;
a second magnetic sub-layer comprising Co—Fe—B and having a thickness of 6 Angstroms;
a third magnetic sub-layer comprising Co—Fe—Hf and having a thickness of about 10 Angstroms; and
a fourth magnetic sub-layer comprising Co—Fe and having a thickness of about 6 Angstroms.

3. The magnetic read head as in claim 1 wherein the second magnetic layer is a multi-layer structure that comprises:
a first magnetic sub-layer comprising Co—Fe;
a second magnetic sub-layer comprising Co—Fe—B;
a third magnetic sub-layer comprising Co—Fe—Hf and having 34 atomic percent Fe and 15 atomic percent Hf; and
a fourth magnetic sub-layer comprising Co—Fe.

4. The magnetic read head as in claim 1 wherein the second magnetic layer is a multi-layer structure that comprises:
a first magnetic sub-layer comprising Co—Fe and having a thickness of about 6 Angstroms;
a second magnetic sub-layer comprising Co—Fe—B and having a thickness of 6 Angstroms;
a third magnetic sub-layer comprising Co—Fe—Hf having 34 atomic percent Fe and 15 atomic percent B and having a thickness of about 10 Angstroms; and
a fourth magnetic sub-layer comprising Co—Fe and having a thickness of about 6 Angstroms.

5. The magnetic read head as in claim 1 wherein the first magnetic layer has a magnetic thickness that is equivalent to a layer of $Ni_{80}Fe_{20}$ having a thickness of about 4.3 Angstroms.

6. The magnetic read head as in claim 1 wherein the second magnetic layer has a magnetic thickness that is equivalent to a layer of $Ni_{80}Fe_{20}$ having a thickness of 4.0 Angstroms.

7. The magnetic read head as in claim 3 wherein the first and second magnetic layers have a thickness delta of about −3 Angstroms.

8. The magnetic read head as in claim 1 wherein the layer of antiferromagnetic material comprises IrMn.

9. A magnetic read head for magnetic data recording, comprising:
a magnetic pinned layer structure comprising a first magnetic layer, a second magnetic layer and a non-magnetic antiparallel coupling layer sandwiched between the first and second magnetic layers;
a magnetic free layer structure;
a non-magnetic layer sandwiched between the magnetic pinned layer structure and the magnetic free layer structure; and
a layer of antiferromagnetic material contacting and exchange coupled with the first magnetic layer of the pinned layer structure;
wherein the AFM layer has a thickness of 65 to 80 Angstroms, and the first magnetic layer comprises CoFe having 20-30 atomic percent Fe;
wherein the second magnetic layer is a multi-layer structure that comprises:
a first magnetic sub-layer comprising Co—Fe;
a second magnetic sub-layer comprising Co—Fe—B;
a third magnetic sub-layer comprising Co—Fe—Hf; and
a fourth magnetic sub-layer comprising Co—Fe.

10. The magnetic read head as in claim 9 wherein the second magnetic layer is a multi-layer structure that comprises:
- a first magnetic sub-layer comprising Co—Fe and having a thickness of about 6 Angstroms;
- a second magnetic sub-layer comprising Co—Fe—B and having a thickness of 6 Angstroms;
- a third magnetic sub-layer comprising Co—Fe—Hf and having a thickness of about 10 Angstroms; and
- a fourth magnetic sub-layer comprising Co—Fe and having a thickness of about 6 Angstroms.

11. The magnetic read head as in claim 9 wherein the second magnetic layer is a multi-layer structure that comprises:
- a first magnetic sub-layer comprising Co—Fe;
- a second magnetic sub-layer comprising Co—Fe—B;
- a third magnetic sub-layer comprising Co—Fe—Hf and having 34 atomic percent Fe and 15 atomic percent Hf; and
- a fourth magnetic sub-layer comprising Co—Fe.

12. The magnetic read head as in claim 9 wherein the second magnetic layer is a multi-layer structure that comprises:
- a first magnetic sub-layer comprising Co—Fe and having a thickness of about 6 Angstroms;
- a second magnetic sub-layer comprising Co—Fe—B and having a thickness of 6 Angstroms;
- a third magnetic sub-layer comprising Co—Fe—Hf having 34 atomic percent Fe and 15 atomic percent B and having a thickness of about 10 Angstroms; and
- a fourth magnetic sub-layer comprising Co—Fe and having a thickness of about 6 Angstroms.

13. The magnetic read head as in claim 9 wherein the first magnetic layer has a magnetic thickness that is equivalent to a layer of $Ni_{80}Fe_{20}$ having a thickness of about 4.3 Angstroms.

14. The magnetic read head as in claim 9 wherein the second magnetic layer has a magnetic thickness that is equivalent to a layer of $Ni_{80}Fe_{20}$ having a thickness of about 4.0 Angstroms.

15. The magnetic read head as in claim 11 wherein the first and second magnetic layers have a thickness delta of about −3 Angstroms.

16. The magnetic read head as in claim 9 wherein the layer of antiferromagnetic material comprises IrMn.

17. A magnetic data storage system, comprising:
- a housing;
- a magnetic media mounted within the housing;
- an actuator mounted within the housing;
- a slider connected with the actuator for movement adjacent to a surface of the magnetic media;
- a read head connected with the slider, the read head comprising:
  - a layer of antiferromagnetic material having a thickness of 65-80 Angstroms;
  - a first magnetic layer formed directly on the layer of antiferromagnetic material, the first magnetic layer comprising Co—Fe with 20-30 atomic percent Fe;
  - a non-magnetic antiparallel coupling layer formed on the first magnetic layer; and
  - a second magnetic layer formed on the non-magnetic antiparallel coupling layer;
  - wherein the second magnetic layer is a multi-layer structure that comprises:
    - a first magnetic sub-layer comprising Co—Fe;
    - a second magnetic sub-layer comprising Co—Fe—B;
    - a third magnetic sub-layer comprising Co—Fe—Hf; and
    - a fourth magnetic sub-layer comprising Co—Fe.

18. The magnetic read head as in claim 17 wherein the second magnetic layer is a multi-layer structure that comprises:
- a first magnetic sub-layer comprising Co—Fe and having a thickness of about 6 Angstroms;
- a second magnetic sub-layer comprising Co—Fe—B and having a thickness of 6 Angstroms;
- a third magnetic sub-layer comprising Co—Fe—Hf and having a thickness of about 10 Angstroms; and
- a fourth magnetic sub-layer comprising Co—Fe and having a thickness of about 6 Angstroms.

19. The magnetic read head as in claim 17 wherein the second magnetic layer is a multi-layer structure that comprises:
- a first magnetic sub-layer comprising Co—Fe;
- a second magnetic sub-layer comprising Co—Fe—B;
- a third magnetic sub-layer comprising Co—Fe—Hf and having 34 atomic percent Fe and 15 atomic percent Hf; and
- a fourth magnetic sub-layer comprising Co—Fe.

20. The magnetic read head as in claim 17 wherein the second magnetic layer is a multi-layer structure that comprises:
- a first magnetic sub-layer comprising Co—Fe and having a thickness of about 6 Angstroms;
- a second magnetic sub-layer comprising Co—Fe—B and having a thickness of 6 Angstroms;
- a third magnetic sub-layer comprising Co—Fe—Hf having 34 atomic percent Fe and 15 atomic percent B and having a thickness of about 10 Angstroms; and
- a fourth magnetic sub-layer comprising Co—Fe and having a thickness of about 6 Angstroms.

21. The magnetic read head as in claim 17 wherein the first magnetic layer has a magnetic thickness that is equivalent to a layer of $Ni_{80}Fe_{20}$ having a thickness of about 4.3 Angstroms.

22. The magnetic read head as in claim 17 wherein the second magnetic layer has a magnetic thickness that is equivalent to a layer of $Ni_{80}Fe_{20}$ having a thickness of about 4.0 Angstroms.

* * * * *